(12) United States Patent
Trivedi et al.

(10) Patent No.: US 6,812,529 B2
(45) Date of Patent: Nov. 2, 2004

(54) SUPPRESSION OF CROSS DIFFUSION AND GATE DEPLETION

(75) Inventors: John D. Trivedi, Boise, ID (US); Zhongze Wang, Boise, ID (US); Chih-Chen Cho, Boise, ID (US); Mike Violette, Boise, ID (US); Todd R. Abbott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 09/808,864

(22) Filed: Mar. 15, 2001

(65) Prior Publication Data

US 2002/0132441 A1 Sep. 19, 2002

(51) Int. Cl.$^7$ ................................................ H01L 29/49
(52) U.S. Cl. ...................... 257/371; 257/751; 257/754; 148/33.3
(58) Field of Search ........................ 148/33.3; 257/371, 257/379, 380, 751, 754

(56) References Cited

U.S. PATENT DOCUMENTS

| | | | | |
|---|---|---|---|---|
| 4,676,866 A | * | 6/1987 | Tang et al. | 438/643 |
| 4,740,479 A | * | 4/1988 | Neppl et al. | 438/233 |
| 4,950,620 A | | 8/1990 | Harrington, III | |
| 5,023,679 A | * | 6/1991 | Shibata | 257/344 |
| 5,191,554 A | | 3/1993 | Lee | |
| 5,355,010 A | * | 10/1994 | Fujii et al. | 257/377 |
| 5,391,520 A | * | 2/1995 | Chen et al. | 438/620 |
| 5,422,499 A | | 6/1995 | Manning | |
| 5,487,037 A | | 1/1996 | Lee | |
| 5,550,079 A | * | 8/1996 | Lin | 438/587 |
| 5,572,461 A | | 11/1996 | Gonzalez | |
| 5,594,683 A | | 1/1997 | Chen et al. | |

(List continued on next page.)

OTHER PUBLICATIONS

Tsukamoto et al.; 0.25um W–Polycide Dual Gate and Buried Metal on Diffusion Layer (BMD) Technology for DRAM–Embedded Logic Devices; Symposium on VLSI Technology Digest of Technical Papers; 1997; pp. 23–24; System LSI Division, Semiconductor Company, Sony Corporation, Japan.

*Primary Examiner*—George Fourson
(74) *Attorney, Agent, or Firm*—Dinsmore & Shohl LLP

(57) ABSTRACT

According to the present invention, an ultrathin buried diffusion barrier layer (UBDBL) is formed over all or part of the doped polysilicon layer of a polysilicide structure composed of the polycrystalline silicon film and an overlying film of a metal, metal silicide, or metal nitride. More specifically, according to one embodiment of the present invention, a memory cell is provided comprising a semiconductor substrate, a P well, an N well, an N type active region, a P type active region, an isolation region, a polysilicide gate electrode structure, and a diffusion barrier layer. The P well is formed in the semiconductor substrate. The N well is formed in the semiconductor substrate adjacent to the P well. The N type active region is defined in the P well and the P type active region is defined in the N well. The isolation region is arranged to isolate the N type active region from the P type active region. The polysilicide gate electrode structure is composed of a polycrystalline silicon film and an overlying metal, metal silicide, or metal nitride film. The polycrystalline silicon film comprises an N+ polysilicon layer formed with the N type active region and a P+ polysilicon layer formed with the P type active region. The diffusion barrier layer is formed in the polysilicide gate electrode structure over a substantial portion of the polycrystalline silicon film between the polycrystalline silicon film and the metal, metal silicide, or metal nitride film.

38 Claims, 6 Drawing Sheets

U.S. PATENT DOCUMENTS

| | | | |
|---|---|---|---|
| 5,795,800 A | 8/1998 | Chan et al. | |
| 5,831,897 A | 11/1998 | Hodges | |
| 5,940,725 A * | 8/1999 | Hunter et al. | 438/592 |
| 6,008,080 A | 12/1999 | Chuang et al. | |
| 6,022,794 A | 2/2000 | Hsu | |
| 6,030,861 A * | 2/2000 | Liu | 438/217 |
| 6,031,267 A | 2/2000 | Lien | |
| 6,054,742 A | 4/2000 | Gonzalez | |
| 6,060,361 A * | 5/2000 | Lee | 438/283 |
| 6,088,259 A | 7/2000 | Chi | |
| 6,100,128 A | 8/2000 | Wang et al. | |
| 6,121,124 A * | 9/2000 | Liu | 438/587 |
| 6,140,684 A | 10/2000 | Chan et al. | |
| 6,174,807 B1 * | 1/2001 | Kizilyalli et al. | 438/655 |
| 6,380,015 B1 * | 4/2002 | Schwalke | 438/199 |

\* cited by examiner

SUPPRESSION OF CROSS DIFFUSION AND GATE DEPLETION

BACKGROUND OF THE INVENTION

The present invention relates to the suppression of cross diffusion and/or gate depletion in integrated circuit devices. More particularly, the present invention relates to a scheme for suppressing cross diffusion and gate depletion in a 6T SRAM cell.

Integrated circuit devices commonly employ a laminar or polysilicide structure composed of a polycrystalline silicon film and an overlying film of a metal, metal silicide, or metal nitride. In many cases, the polycrystalline silicon film comprises an N+ polysilicon region doped with an N type impurity and a P+ polysilicon region doped with a P type impurity. The present inventors have recognized that many P+ and N+ dopant materials are subject to migration from a given polysilicon layer to another polysilicon layer, to an overlying conductive layer, or to another region of the given polysilicon layer. As a result, these opposite types of impurities are subject to cross diffusion. This cross diffusion can lead to performance degradation in the integrated circuit device.

Accordingly, there is a need for a scheme for suppressing cross diffusion of dopant materials between oppositely doped regions of polysilicon layers in integrated circuit devices.

BRIEF SUMMARY OF THE INVENTION

This need is met by the present invention wherein an ultrathin buried diffusion barrier layer (UBDBL) is formed over all or part of the doped polysilicon layer of a polysilicide structure composed of the polycrystalline silicon film and an overlying film of a metal, metal silicide, or metal nitride.

In accordance with one embodiment of the present invention, a memory cell is provided comprising a semiconductor substrate, a P well, an N well, an N type active region, a P type active region, an isolation region, a polysilicide gate electrode structure, and a diffusion barrier layer. The P well is formed in the semiconductor substrate. The N well is formed in the semiconductor substrate adjacent to the P well. The N type active region is defined in the P well and the P type active region is defined in the N well. The isolation region is arranged to isolate the N type active region from the P type active region. The polysilicide gate electrode structure is composed of a polycrystalline silicon film and an overlying metal, metal silicide, or metal nitride film. The polycrystalline silicon film comprises an N+ polysilicon layer over the N type active region and a P+ polysilicon layer over the P type active region. The diffusion barrier layer is formed in the polysilicide gate electrode structure over a substantial portion of the polycrystalline silicon film between the polycrystalline silicon film and the metal, metal silicide, or metal nitride film.

In accordance with another embodiment of the present invention, a memory cell is provide comprising a semiconductor substrate, a P well, an N well, an NMOS transistor, a PMOS transistor, an isolation region, a polysilicide gate electrode structure, and a diffusion barrier layer. The P well is formed in the semiconductor substrate. The N well is formed in the semiconductor substrate. The NMOS transistor defines an N type active region in the P well. The PMOS transistor defining a P type active region in the N well. The isolation region is arranged to isolate the N type active region from the P type active region. The polysilicide gate electrode structure is composed of a polycrystalline silicon film and an overlying metal, metal silicide, or metal nitride film. The polycrystalline silicon film comprises an N+ polysilicon layer forming a portion of the NMOS transistor and a P+ polysilicon layer forming a portion of the PMOS transistor. The diffusion barrier layer is formed in the polysilicide gate electrode structure over a substantial portion of the polycrystalline silicon film between the polycrystalline silicon film and the metal, metal silicide, or metal nitride film.

Preferably, the diffusion barrier layer comprises an ultrathin diffusion barrier layer and has a thickness of between about 5 Å and about 25 Å.

In accordance with yet another embodiment of the present invention, an SRAM memory cell is provided comprising a semiconductor substrate, a P well, an N well, a flip flop, an isolation region, a polysilicide gate electrode structure, and a diffusion barrier layer. The P well formed in the semiconductor substrate. The N well formed is in the semiconductor substrate. The flip-flop is formed by two access transistors and a pair of cross coupled inverters. Each pair of cross-coupled inverters includes a pull up transistor and a pull down transistor. The pull-up transistor defines a P type active region in the N well and the pull-down transistor defines an N type active region in the P well. The isolation region is arranged to isolate the N type active region from the P type active region. The polysilicide gate electrode structure is composed of a polycrystalline silicon film and an overlying metal, metal silicide, or metal nitride film. The polycrystalline silicon film comprises an N+ polysilicon layer forming a portion of the pull-down transistor and a P+ polysilicon layer forming a portion of the pull-up transistor. The diffusion barrier layer is formed in the polysilicide gate electrode structure between the polycrystalline silicon film and the metal, metal silicide, or metal nitride film over a substantial portion of the polycrystalline silicon film.

In accordance with yet another embodiment of the present invention, an SRAM memory cell is provided comprising a semiconductor substrate, a P well, an N well, a flip flop, an isolation region, a polysilicide gate electrode structure, and a diffusion barrier layer. The flip-flop is formed by two access transistors and a pair of cross coupled inverters. Each pair of cross-coupled inverters includes a pull up transistor and a pull down transistor. The pull-up transistor defines a P type active region in the N well and the pull-down transistor defines an N type active region in the P well. The isolation region is arranged to isolate the N type active region from the P type active region. The polysilicide gate electrode structure is composed of a polycrystalline silicon film and an overlying metal, metal silicide, or metal nitride film. The polycrystalline silicon film comprises an N+ polysilicon layer forming a portion of the pull-down transistor and a P+ polysilicon layer forming a portion of the pull-up transistor. The diffusion barrier layer is formed in the polysilicide gate electrode structure between the polycrystalline silicon film and the metal, metal silicide, or metal nitride film over a substantial portion of the N+ polysilicon layer and the P+ polysilicon layer.

In accordance with yet another embodiment of the present invention, a memory cell array is provided comprising a plurality of SRAM cells arranged in rows and columns. Each cell of the array is connected to a word line and to a pair of bit lines and comprises a semiconductor substrate, a P well, an N well, a flip flop, an isolation region, a polysilicide gate electrode structure, and a diffusion barrier layer. The flip-flop is formed by two access transistors and a pair of cross coupled inverters. Each pair of cross-coupled inverters includes a pull up transistor and a pull down transistor. The pull-up transistor defines a P type active region in the N well and the pull-down transistor defines an N type active region in the P well. The isolation region is arranged to isolate the N type active region from the P type active region. The polysilicide gate electrode structure is composed of a polycrystalline silicon film and an overlying metal, metal silicide, or metal nitride film. The polycrystalline silicon film comprises an N+ polysilicon layer forming a portion of the pull-down transistor and a P+ polysilicon layer forming a portion of the pull-up transistor. The diffusion barrier layer is formed in the polysilicide gate electrode structure between the polycrystalline silicon film and the metal, metal silicide, or metal nitride film over a substantial portion of the polycrystalline silicon film.

In accordance with yet another embodiment of the present invention, a computer system is provided including a microprocessor in communication with a memory cell array via a data communication path. The memory cell array comprises a plurality of SRAM cells arranged in rows and columns. Each cell of the array is connected to a word line and to a pair of bit lines and comprises a semiconductor substrate, a P well, an N well, a flip flop, an isolation region, a polysilicide gate electrode structure, and a diffusion barrier layer. The flip-flop is formed by two access transistors and a pair of cross coupled inverters. Each pair of cross-coupled inverters includes a pull up transistor and a pull down transistor. The pull-up transistor defines a P type active region in the N well and the pull-down transistor defines an N type active region in the P well. An isolation region is arranged to isolate the N type active region from the P type active region. A polysilicide gate electrode structure is composed of a polycrystalline silicon film and an overlying metal, metal silicide, or metal nitride film. The polycrystalline silicon film comprises an N+ polysilicon layer forming a portion of the pull-down transistor and a P+ polysilicon layer forming a portion of the pull-up transistor. The diffusion barrier layer is formed in the polysilicide gate electrode structure between the polycrystalline silicon film and the metal, metal silicide, or metal nitride film over a substantial portion of the polycrystalline silicon film.

In accordance with yet another embodiment of the present invention, a method of fabricating an SRAM memory cell is provided. Recited in terms of physical location, as opposed to chronological order of processing, the method comprises the steps of (i) providing a semiconductor substrate, (ii) forming a P well in the semiconductor substrate, (iii) forming an N well in the semiconductor substrate, (iv) forming a P type active region of a pull-up transistor in the N well, (v) forming a gate oxide layer and a conductive gate of the pull-up transistor over the P type active region, (vi) forming an N type active region of a pull-down transistor in the P well; (vii) forming a gate oxide layer and a conductive gate of the pull-down transistor over the N type active region, (viii) forming an isolation region between the N type active region and the P type active region, (ix) forming a polycrystalline silicon film over the pull-down transistor and the pull-up transistor, (x) doping selectively the polycrystalline silicon film to form an N+ polysilicon layer over the pull-down transistor and a P+ polysilicon layer over the pull-up transistor; (xi) forming a diffusion barrier layer over a substantial portion of the polycrystalline silicon film, and (xii) forming a metal, metal silicide, or metal nitride film over the doped polycrystalline silicon film and the diffusion barrier layer. The diffusion barrier layer is formed by selective chemical oxidation of the polycrystalline silicon film.

In accordance with yet another embodiment of the present invention, a method of fabricating a memory cell array by arranging a plurality of the SRAM cells in rows and columns and connecting each SRAM cell of the array to a word line and to a pair of bit lines is provided. Recited in terms of physical location, as opposed to chronological order of processing, each of the SRAM cells is fabricated by (i) providing a semiconductor substrate, (ii) forming a P well in the semiconductor substrate, (iii) forming an N well in the semiconductor substrate, (iv) providing a flip-flop including two access transistors and a pair of cross coupled inverters wherein each pair of cross-coupled inverters includes a pull up transistor and a pull down transistor and wherein the pull-up transistor defines a P type active region in the N well and the pull-down transistor defines an N type active region in the P well, (v) arranging an isolation region to isolate the N type active region from the P type active region, (vi) providing a polysilicide gate electrode structure composed of a polycrystalline silicon film and an overlying metal, metal silicide, or metal nitride film, wherein the polycrystalline silicon film comprises an N+ polysilicon layer forming a portion of the pull-down transistor and a P+ polysilicon layer forming a portion of the pull-up transistor, and (vii) forming a diffusion barrier layer in the polysilicide gate electrode structure between the polycrystalline silicon film and the metal, metal silicide, or metal nitride film over a substantial portion of the polycrystalline silicon film.

In accordance with yet another embodiment of the present invention, a method of fabricating a computer system is provided. The computer system is fabricated by arranging a microprocessor in communication with a memory cell array via a data communication path and fabricating the memory cell array by arranging a plurality of the SRAM cells in rows and columns and connecting each SRAM cell of the array to a word line and to a pair of bit lines. Recited in terms of physical location, as opposed to chronological order of processing, each of the SRAM cells is fabricated by (i) providing a semiconductor substrate, (ii) forming a P well in the semiconductor substrate, (iii) forming an N well in the semiconductor substrate, (iv) providing a flip-flop including two access transistors and a pair of cross coupled inverters, wherein each pair of cross-coupled inverters includes a pull up transistor and a pull down transistor, and wherein the pull-up transistor defines a P type active region in the N well and the pull-down transistor defines an N type active region in the P well, (v) arranging an isolation region to isolate the N type active region from the P type active region, (vi) providing a polysilicide gate electrode structure composed of a polycrystalline silicon film and an overlying metal, metal silicide, or metal nitride film, wherein the polycrystalline silicon film comprises an N+ polysilicon layer forming a portion of the pull-down transistor and a P+ polysilicon layer forming a portion of the pull-up transistor, (vii) forming a diffusion barrier layer in the polysilicide gate electrode structure between the polycrystalline silicon film and the metal, metal silicide, or metal nitride film over a substantial portion of the polycrystalline silicon film.

Accordingly, it is an object of the present invention to provide an integrated circuit and an integrated circuit fabrication scheme where cross diffusion of dopant materials between oppositely doped regions of polysilicon layers is suppressed. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
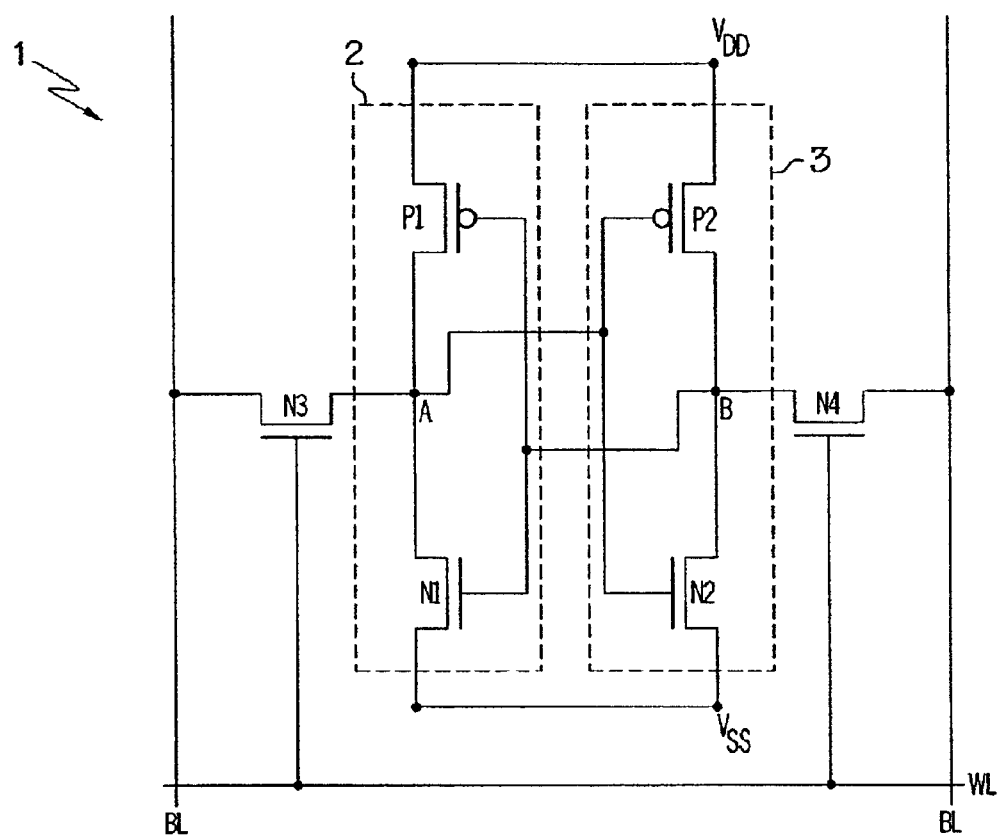
FIG. 1 is a schematic circuit diagram of a six transistor SRAM cell according to the present invention.
Figure 2:
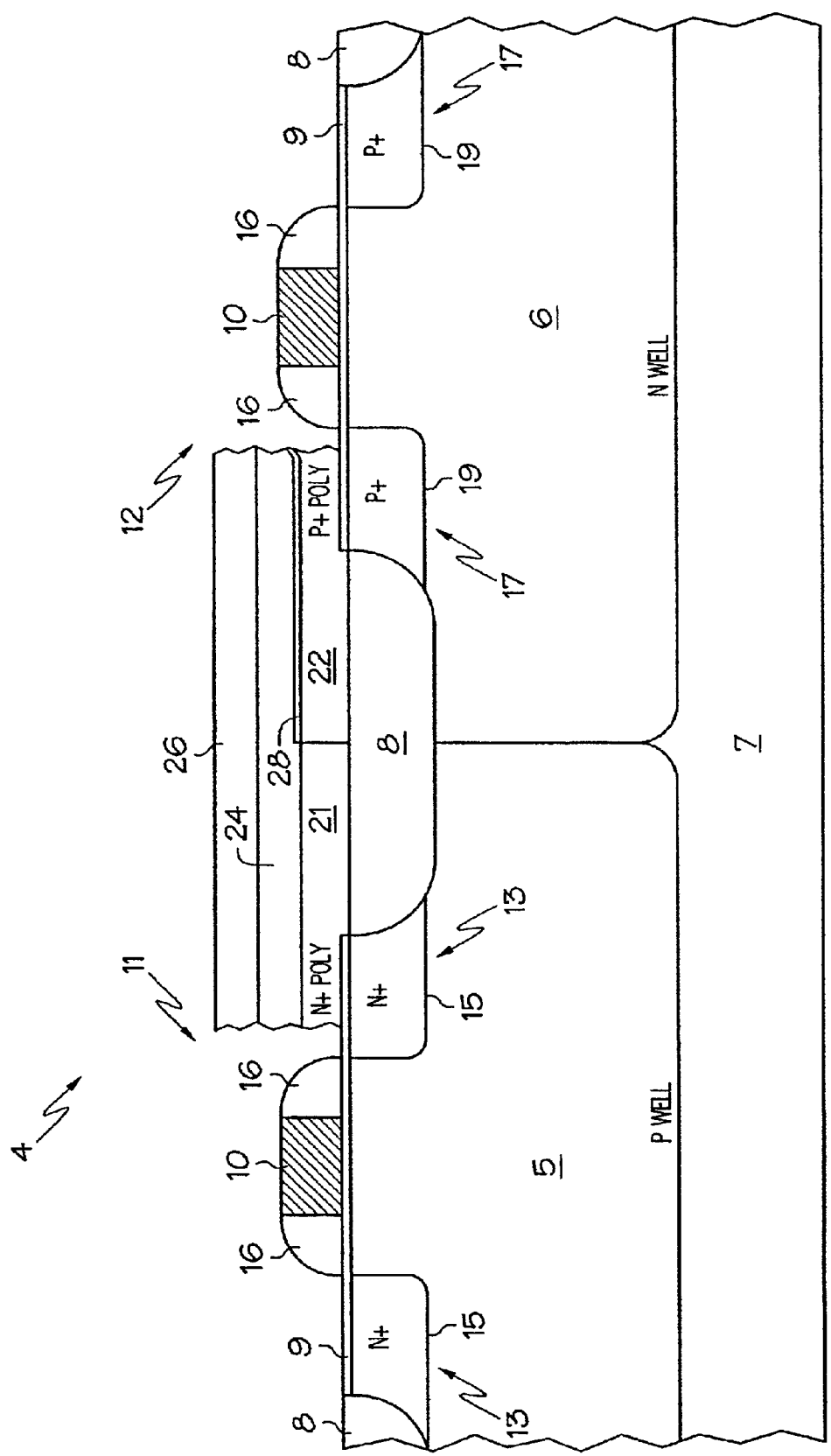
FIG. 2 is a cross-sectional view of a CMOS structure used in the SRAM cell illustrated in FIG. 1.

Initially, the present invention may be illustrated in the context of a six transistor static random access memory cell (See FIGS. 1 and 2). Most metal oxide semiconductor (MOS) static random access memories (SRAMs) have in common a basic cell consisting of two transistors and two load elements in a flip-flop configuration, together with two access transistors. For example, FIG. 1 presents a schematic circuit diagram of a six transistor (6T) SRAM cell. The SRAM cell 1 includes two N type MOS (NMOS) transistors N1 and N2 coupled between $V_{SS}$ and nodes A and B, respectively. Nodes A and B are further coupled to $V_{DD}$ by pull up P type MOS (PMOS) transistors P1 and P2, respectively. Node A is further coupled to the gates of transistors P2 and N2 and node B is similarly coupled to the gates of transistors P1 and N1. $V_{SS}$ is typically ground and $V_{DD}$ is typically 3.3 volts or 5.0 volts.

Information is stored in SRAM cell 1 in the form of voltage levels in the flip-flop formed by the two cross-coupled inverters 2 and 3 formed by transistors P1, N1 and P2, N2, respectively. Specifically, when node A is at a logic low state, i.e., when the voltage of node A is approximately equal to $V_{SS}$, transistor P2 is on and transistor N2 is off. When transistor P2 is on and transistor N2 is off, node B is at a logic high state, i.e., the voltage of node B is pulled up to approximately $V_{DD}$. When node B is at a logic high state, transistor P1 is off and transistor N1 is on. When transistor P1 is off and transistor N1 is on, node A is at a logic low state. In this manner, SRAM cell 1 remains in a latched state.

Nodes A and B are further coupled to bit lines BL by NMOS access transistors N3 and N4, respectively. The gates of transistors N3 and N4 are coupled to a word line WL to enable conventional read and write operations.

FIG. 2 is a cross-sectional view of a conventional complimentary metal oxide semiconductor (CMOS) structure 4 used in conventional 6T SRAM cells like the one described with reference to FIG. 1. As is shown in FIG. 2, a P well 5 and an N well 6 are formed adjacent to each other in a semiconductor substrate 7. Formed at the surface of substrate 7 are isolation regions 8, i.e., shallow trench isolation regions, field oxide regions, etc. Formed above P well 5 and N well 6 are gate oxide layers 9. Formed over gate oxide layers 9 are conductive gates 10 of an NMOS transistor 11 and a PMOS transistor 12. The PMOS transistor 12 may be a pull up transistor of an SRAM cell. The NMOS transistor 11 may be a pull down/access transistor of an SRAM cell. The CMOS structure 4 includes an N type active region defined in the P well 5 of the NMOS transistor 11 and a P type active region defined in the N well 6 of the PMOS transistor 12. The isolation regions 8 are defined between the N type and P type active regions of the CMOS structure and isolate electrically the N type and P type active regions of the substrate 7 from each other.

As is shown in FIG. 2, N+ source/drain regions 13 of the NMOS transistor 11 include N+ heavily doped source/drain regions 15 laterally aligned (self aligned) to sidewall spacers 16. Similarly, P type source/drain regions 17 of the PMOS transistor 12 include P+ heavily doped source/drain regions 19 laterally aligned (self aligned) to sidewall spacers 16.

The gate electrode structure of the CMOS structure 4 is constructed to have a laminar or polysilicide structure composed of a polycrystalline silicon film and an overlying film of a metal, metal silicide, or metal nitride. Specifically, the polycrystalline silicon film comprises an N+ polysilicon layer 21 formed over the NMOS transistor 11 and a P+ polysilicon layer 22 formed over the PMOS transistor 12. Each of the polysilicon layers 21, 22 typically provide a connection to a transistor gate. The N+ polysilicon layer 21 is doped with an N type impurity such as arsenic (As) or phosphorous P31. The P+ polysilicon layer 22 is doped with an N type impurity such as boron (B). The overlying metal, metal silicide, or metal nitride layer 24 is typically formed of a tungsten silicide ($WSi_x$: x=2, for example) and contributes to an accelerated signal transmission rate because the specific resistance of the metal, metal silicide, or metal nitride layer 24 is lower than that of the polycrystalline silicon layers 21, 22. The metal, metal silicide, or metal nitride layer 24 may be made of not only $WSi_x$ but also molybdenum silicide $MoSi_x$, titanium silicide $TiSi_x$, tantalum silicide $TaSi_x$, cobalt silicide, nitrides of these metals, etc. An insulating capping layer 26 is formed over the $WSi_x$ layer 24 and is typically formed of silicon dioxide or silicon nitride.

P+ and N+ dopant materials like arsenic and boron are subject to migration from a given portion of a polysilicon layer to another portion of the polysilicon layer or another polysilicon layer where the layers are covered by a metal, metal silicide, or metal nitride layer. Specifically, the dopant materials will migrate from the originating polysilicon layer, through the overlying metal, metal silicide, or metal nitride layer, to the other region of the polysilicon layer or another polysilicon layer. This migration or cross-diffusion results in depletion of the doped polysilicon layers. According to the present invention, an ultrathin buried diffusion barrier layer (UBDBL) 28 is formed over the P+ polysilicon layer 22 illustrated in FIG. 2 to address this problem. The UBDBL layer 28 also prevents poly depletion by not allowing N+ dopants to counter dope P+ dopants in the P+ polysilicon layer 22 or other P+ polysilicon region.

The UBDBL layer 28, which may, for example, be a thin silicon dioxide layer, a thin silicon nitride layer, or another form of barrier layer, suppresses the migration of N+ dopant material from the N+ polysilicon layer 21 into the P+ polysilicon layer 22. Specifically, the N+ dopant material, which may be arsenic, moves relatively quickly in the overlying metal, metal silicide, or metal nitride layer 24 but will not readily migrate through the UBDBL layer 28. Thus, the UBDBL layer 28 suppresses undesirable cross-diffusion of the N+ dopant into the associated P+ polysilicon layer 22. Similarly, any P+ dopant material (e.g., boron) in the UBDBL layer 28 will not readily migrate out of the UBDBL layer 28. Thus, the UBDBL layer 28 suppresses undesirable cross-diffusion of the P+ dopant into the associated N+ polysilicon layer 21. In this manner, the UBDBL layer 28 forms a significant barrier to migration of the N+ dopant and the P+ dopant and, as such, may be used to suppress cross-diffusion.

The thickness of the UBDBL layer 28 is selected to minimize its impact on device performance. Specifically, it is noted that, throughout the various embodiments of the present invention, electrical connections are established between specific electrode structures and the associated polysilicon layers of the present invention by means of capacitive coupling through the UBDBL layer 28. Further, UBDBL layer is preferably only utilized over doped polysilicon layers of pull-up and pull-down devices because the operational speed of these devices is not as critical to SRAM performance as is, for example, the operational speed of SRAM periphery transistors. Typically, the thickness of the UBDBL 28 is between about 10 Å and 15 Å. However, it is noted that UBDBL thicknesses as low as 3 Å and as high as 125 A may be employed according to the present invention. By comparison, the polysilicon layers 21, 22 typically have thicknesses in the range of between about 500 Å and 4000 Å and the metal, metal silicide, or metal nitride layer 24 typically has a thicknesses of about 500 Å to about 1500 Å. The UBDBL 28 may be formed, for example, through convention chemical oxidation processes, including oxidation in dilute $H_2O_2$, furnace oxidation, remote plasma oxidation, etc.

The UBDBL layer 28 is particularly advantageous where the N+ polysilicon layer 21 is doped with a material that migrates in the metal, metal silicide, or metal nitride layer 24. More specifically, the UBDBL layer 28 is particularly advantageous where the N+ polysilicon layer 21 is doped with arsenic (As), the P+ polysilicon layer 22 is doped with boron (B), and the overlying metal, metal silicide, or metal nitride layer 24 is a $WSi_X$ metal silicide layer.

It is noted that only a portion of the polysilicon layers 21, 22, the metal, metal silicide, or metal nitride layer 24, the capping layer 26, and the UBDBL layer 28 are illustrated in FIG. 2 because the manner in which they are patterned and configured is largely dependent upon the design constraints of the specific integrated circuit structure and is outside the scope of the present invention. The present invention relates primarily to the interposition of the UBDBL layer 28 between the P+ polysilicon layer 22 and the metal, metal silicide, or metal nitride layer 24 to suppress the cross diffusion of the N+ dopant from the into the P+ polysilicon layer 22.

Figure 3:
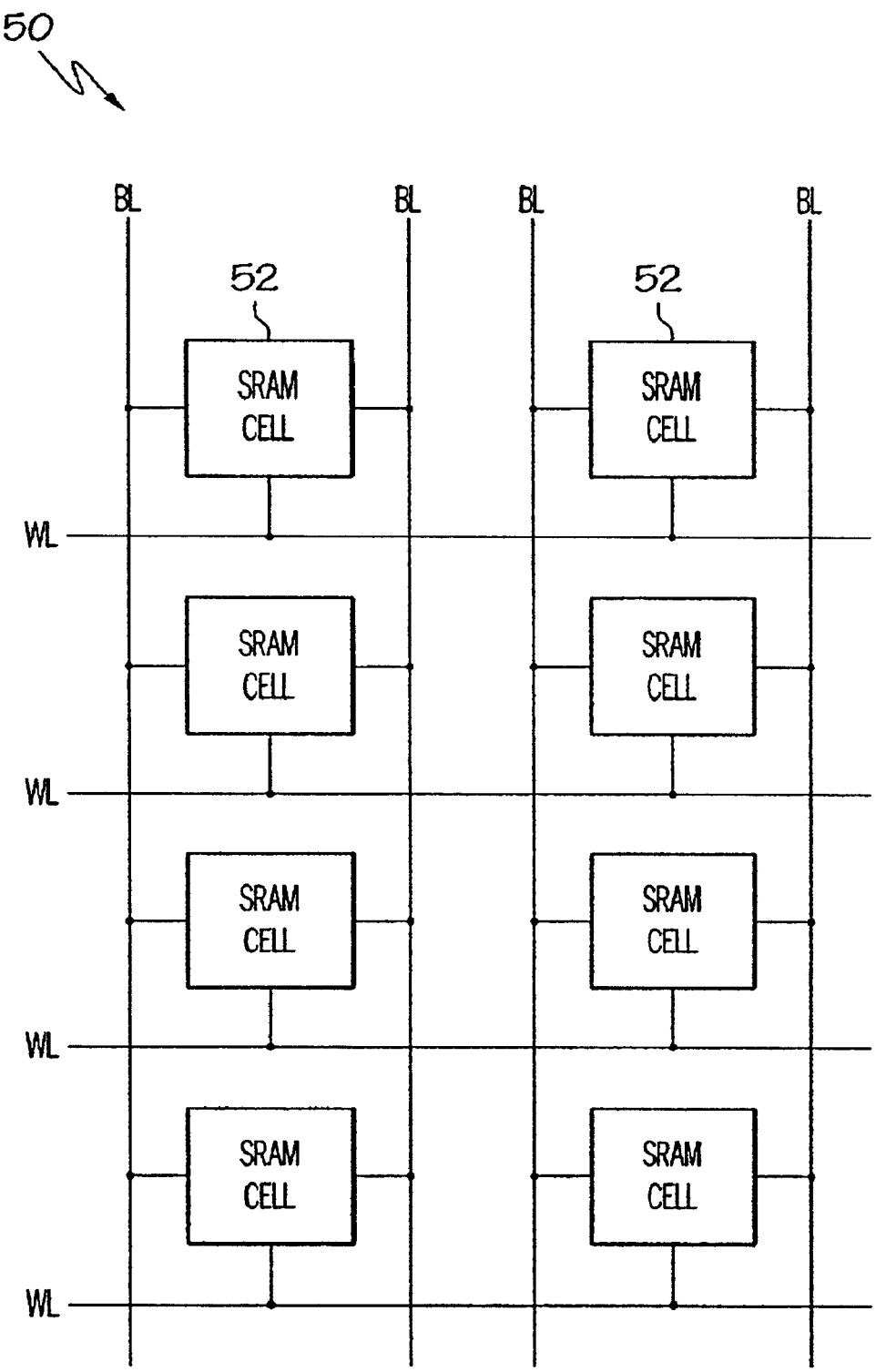
FIG. 3 is an illustration of an SRAM cell array according to the present invention.
Figure 4:
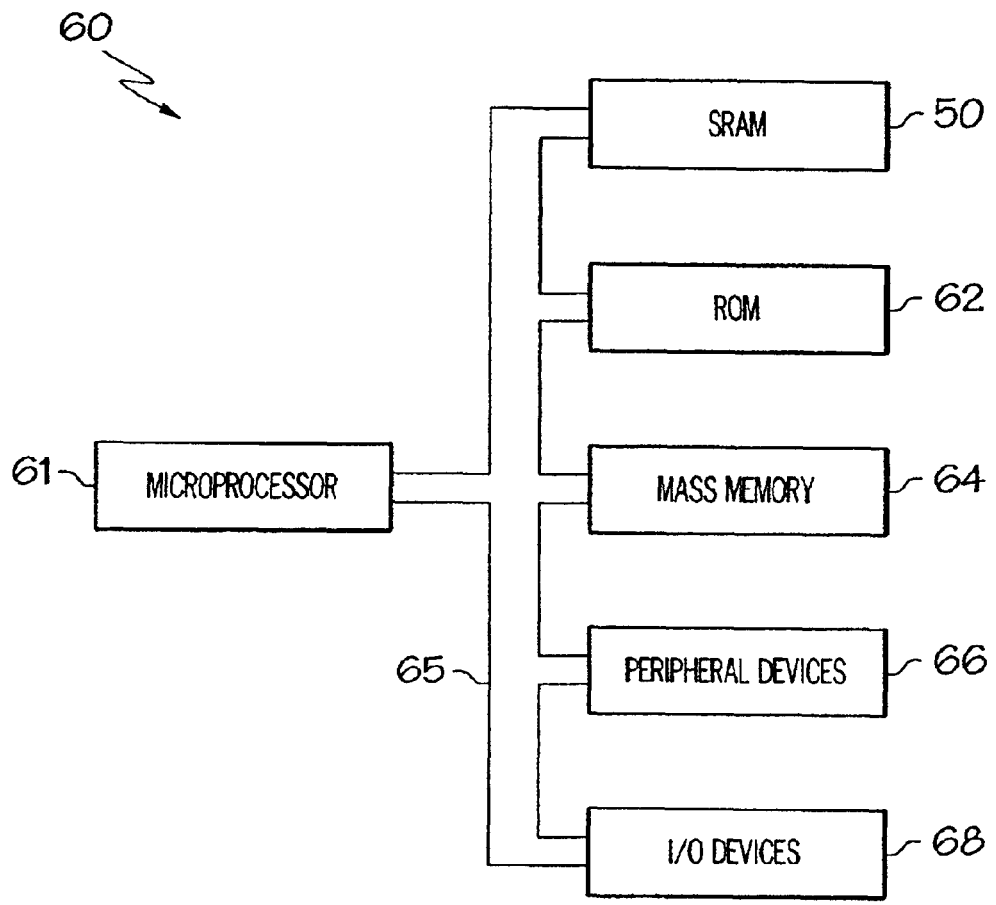
FIG. 4 is a schematic block diagram of a computer system according to the present invention.

Referring to FIG. 3, an SRAM cell array 50 embodying the present invention is illustrated. The array 50 includes a number of SRAM cells 52 arranged in rows and columns. Each cell 52 is connected to a word line WL and to a pair of bit lines BL. A computer system 60 including a microprocessor 61 in communication with an SRAM cell array 50 of the present invention is illustrated in FIG. 4. The computer system 60 further includes ROM 62, mass memory 64, peripheral devices 66, and I/O devices 68, all in communication with the microprocessor 62 via a data bus 65 or another suitable data communication path.

Figure 5:
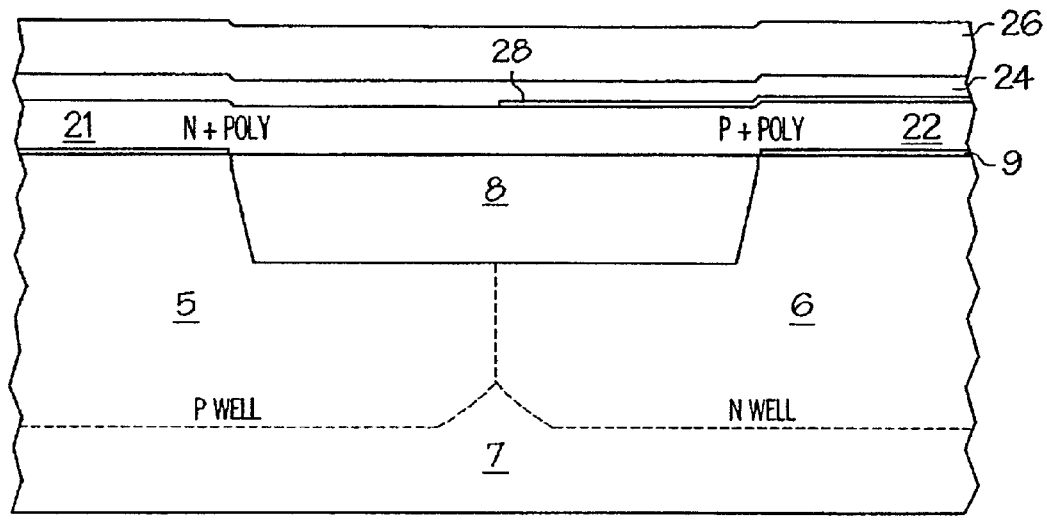
FIGS. 5–7 are schematic illustrations of schemes for suppressing cross diffusion according to the present invention.
Figure 6:
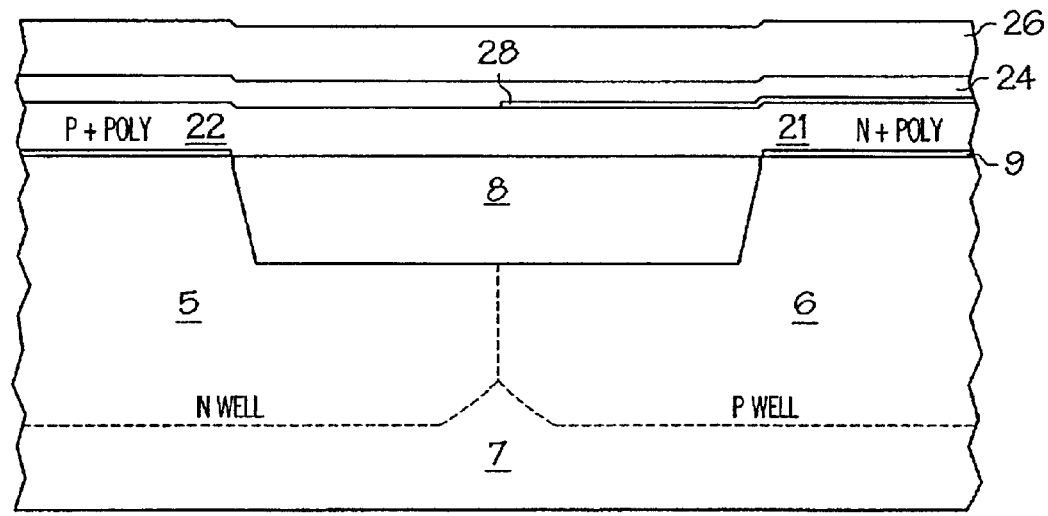
Figure 7:
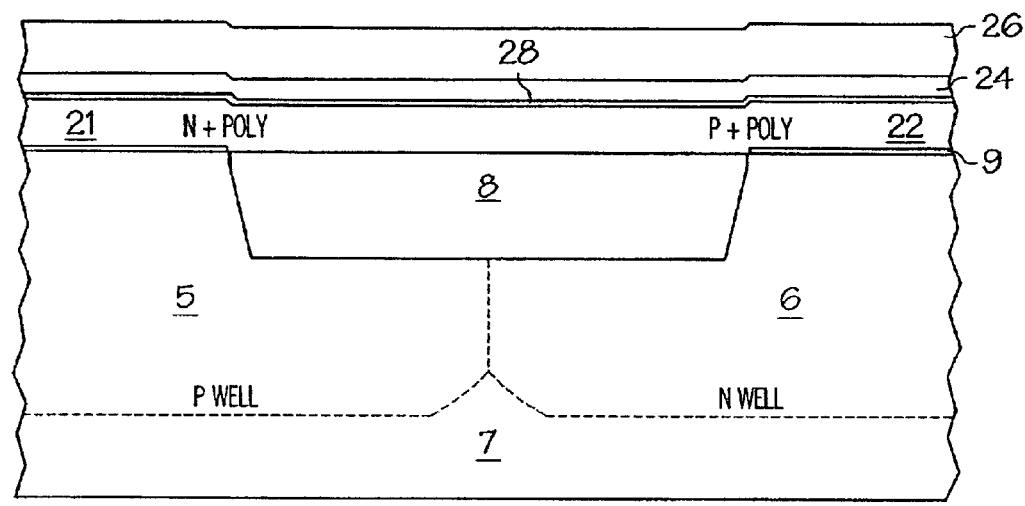

Referring now to FIGS. 5–7, although the present invention is well-suited for use in the context of the 6T SRAM cell described with reference to FIGS. 1–4, it is noted that the present invention is also more generally applicable to integrated circuit structures where cross diffusion and gate depletion are a concern. Accordingly, the present invention is also described herein with reference to FIGS. 5–7, which provide a more general illustration of integrated circuit structures where cross diffusion and gate depletion are a concern.

In the embodiment illustrated in FIG. 5, the UBDBL 28 and the polysilicide gate electrode structure are arranged such that the UBDBL 28 is formed over a substantial portion of the P+ polysilicon layer 22 between the P+ polysilicon layer 22 and the metal, metal silicide, or metal nitride film 24 and does not extend over a substantial portion of the N+ polysilicon layer 21. Stated differently, the UBDBL 28 is arranged such that the metal, metal silicide, or metal nitride film 24 is in direct contact with the N+ polysilicon layer 21 and defines an N type common boundary with the N+ polysilicon layer 21 that is significantly larger than any P type common boundary defined by the metal, metal silicide, or metal nitride film 24 and the P+ polysilicon layer 22. The UBDBL 28 may be formed over the entire extent of that portion of the P+ polysilicon layer 22 that is overcoated by the metal, metal silicide, or metal nitride film 24. In this manner, migration of P+ dopants from the P+ polysilicon layer 22 to the overlying metal, metal silicide, or metal nitride film 24 is significantly impeded by the UBDBL 28. Although dopants from the N+ polysilicon layer 21 enter the overlying metal, metal silicide, or metal nitride film 24, cross diffusion and P+ poly gate depletion are suppressed because these dopants, present in the overlying metal, metal silicide, or metal nitride film 24, cannot cross the UBDBL 28 and enter the P+ polysilicon layer 22.

Similarly, in the embodiment illustrated in FIG. 6, the UBDBL 28 and the polysilicide gate electrode structure are arranged such that the UBDBL 28 is formed over a substantial portion of the N+ polysilicon layer 21 between the N+ polysilicon layer 21 and the metal, metal silicide, or metal nitride film 24 and does not extend over a substantial portion of the P+ polysilicon layer 22. Stated differently, the UBDBL 28 is arranged such that the metal, metal silicide, or metal nitride film 24 is in direct contact with the P+ polysilicon layer 22 and defines an P type common boundary with the P+ polysilicon layer 22 that is significantly larger than any N type common boundary defined by the metal, metal silicide, or metal nitride film 24 and the N+ polysilicon layer 21. The UBDBL 28 may be formed over the entire extent of that portion of the N+ polysilicon layer 21 that is overcoated by the metal, metal silicide, or metal nitride film 24. In this manner, migration of N+ dopants from the N+ polysilicon layer 21 to the overlying metal, metal silicide, or metal nitride film 26 is significantly impeded by the UBDBL 28. Although dopants from the P+ polysilicon layer 22 enter the overlying metal, metal silicide, or metal nitride film 24, cross diffusion and N+ poly gate depletion are suppressed because these dopants, present in the overlying metal, metal silicide, or metal nitride film 24, cannot cross the UBDBL 28 and enter the N+ polysilicon layer 21.

Finally, in the embodiment illustrated in FIG. 7, the UBDBL 28 is formed in the polysilicide gate electrode structure over the N+ polysilicon layer 21 and the P+ polysilicon layer 22. In this manner, migration of P+ dopants from the P+ polysilicon layer 22 and migration of N+ dopants from the N+ polysilicon layer 21 to the overlying metal, metal silicide, or metal nitride film 24 is significantly impeded by the UBDBL 28. Cross diffusion and gate depletion are suppressed because the dopants cannot cross the UBDBL 28 and enter the opposite polysilicon layer.

The various layers, regions, and structures of the device according to the present invention may be formed by utilizing conventional semiconductor device fabrication techniques. The selection of these specific techniques may vary from application to application and, with the exception of the fabrication steps outlined herein, is not the subject of the present invention. Referring to FIG. 2, an SRAM memory cell according to the present invention may be fabricated by providing a semiconductor substrate 7 and forming the P well 5 and the N well 6 in the semiconductor substrate 7. The P type active region of the pull-up transistor 12 is formed in the N well 6 and the gate oxide layer 9 and the conductive gate 10 of the pull-up transistor 12 are formed over the P type active region. The N type active region of the pull-down transistor 11 is formed in the P well 5 and the gate oxide layer 9 and the conductive gate 10 of the pull-down transistor 11 are formed over the N type active region. The isolation regions 8 are formed between the N type active region and the P type active region. The polycrystalline silicon film is formed over the pull-down transistor and the pull-up transistor and is doped selectively to form the N+ polysilicon layer 21 over the pull-down transistor 11 and the P+ polysilicon layer 22 over the pull-up transistor 12. The UBDBL or diffusion barrier layer 28 is formed over the entire polycrystalline silicon, or at least a substantial portion thereof, and the metal, metal silicide, or metal nitride film 24 is formed over the doped polycrystalline silicon film and the diffusion barrier layer 28. Preferably, the diffusion barrier layer 28 is formed by selective chemical oxidation of the polycrystalline silicon film or rapid plasma nitridation.

To fabricate the memory cell array 50 of FIG. 3, the SRAM cells 52 are arranged in rows and columns and each SRAM cell 52 of the array 50 is connected to a word line WL and to a pair of bit lines BL. To fabricate the computer system 60, the microprocessor 61 is arranged in communication with the memory cell array 50 via a data communication path 65.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A memory cell comprising:
a semiconductor substrate;
a P well formed in said semiconductor substrate;
an N well formed in said semiconductor substrate adjacent to said P well;
an N type active region defined in said P well;
a P type active region defined in said N well;
an isolation region arranged to isolate said N type active region from said P type active region;
a polysilicide gate electrode structure composed of a polycrystalline silicon film and an overlying metal, metal silicide, or metal nitride film, wherein said polycrystalline silicon film comprises an N+ polysilicon layer over said N type active region and a P+ polysilicon layer over said P type active region; and
an oxide diffusion barrier layer formed in said polysilicide gate electrode structure on a portion of said polycrystalline silicon film between said polycrystalline silicon film and said metal, metal silicide, or metal nitride film, and over only a portion of said isolation region.

2. A memory cell comprising:
a semiconductor substrate;
a P well formed in said semiconductor substrate;
an N well formed in said semiconductor substrate;
an NMOS transistor defining an N type active region in said P well;
a PMOS transistor defining a P type active region in said N well;
an isolation region arranged to isolate said N type active region from said P type active region;
a polysilicide gate electrode structure composed of a polycrystalline silicon film and an overlying metal, metal silicide, or metal nitride film, wherein said polycrystalline silicon film comprises an N+ polysilicon layer forming a portion of said NMOS transistor, and a P+ polysilicon layer forming a portion of said PMOS transistor; and
an oxide diffusion barrier layer formed in said polysilicide gate electrode structure on a portion of said polycrystalline silicon film between said polycrystalline silicon film and said metal, metal silicide, or metal nitride film, and over only a portion of said isolation region.

3. A memory cell comprising:
a semiconductor substrate having first and second gate oxide layers;
a P well formed in said semiconductor substrate;
an N well formed in said semiconductor substrate;
an NMOS transistor defining an N type active region in said P well;
a PMOS transistor defining a P type active region in said N well;
an isolation region arranged to isolate said N type active region from said P type active region, and separate said first and second gate oxide layers;
a polysilicide gate electrode structure composed of a polycrystalline silicon film and an overlying metal, metal silicide, or metal nitride film, wherein said polycrystalline silicon film comprises an N+ polysilicon layer on said first gate oxide layer and on a first portion of said isolation region and forming a portion of said NMOS transistor, and a P+ polysilicon layer on said second gate oxide layer and on a second portion of said isolation region and forming a portion of said PMOS transistor; and
an oxide diffusion barrier layer formed in said polysilicide gate electrode structure between said polycrystalline silicon film and said metal, metal silicide, or metal nitride film and over only one of said first and second portions of said isolation region, wherein said polysilicide gate electrode structure and said oxide diffusion barrier layer are arranged such that migration of P+ dopants from said P+ polysilicon layer to said overlying metal, metal silicide, or metal nitride film is significantly impeded by said oxide diffusion barrier layer.

4. A memory cell comprising:
a semiconductor substrate;
a P well formed in said semiconductor substrate;
an N well formed in said semiconductor substrate;
an NMOS transistor defining an N type active region in said P well;
a PMOS transistor defining a P type active region in said N well;
an isolation region arranged to isolate said N type active region from said P type active region;
a polysilicide gate electrode structure composed of a polycrystalline silicon film and an overlying metal, metal silicide, or metal nitride film, wherein said polycrystalline silicon film comprises an N+ polysilicon layer forming a portion of said NMOS transistor and a P+ polysilicon layer forming a portion of said PMOS transistor, and
an oxide diffusion barrier layer formed in said polysilicide gate electrode structure on said P+ polysilicon layer between maid P+ polysilicon layer and said metal, metal silicide, or metal nitride film and over only a portion of said isolation region, wherein said oxide diffusion barrier layer does not extend over a portion of said N+ polysilicon layer.

5. A memory cell comprising:

a semiconductor substrate;

a P well formed in said semiconductor substrate;

an N well formed in said semiconductor substrate;

an NMOS transistor defining an N type active region in said P well;

a PMOS transistor defining a P type active region in said N well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said NMOS transistor and a P+ polysilicon layer forming a portion of said PMOS transistor and an oxide diffusion barrier layer formed in said polysilicide gate electrode structure on said P+ polysilicon layer between said P+ polysilicon layer and said metal, metal silicide, or metal nitride film and over only a portion of said isolation region, wherein said oxide diffusion barrier layer is arranged such that said metal, metal silicide, or metal nitride film defines an N type common boundary with said N+ polysilicon layer that is significantly larger than a P type common boundary defined by said metal, metal silicide, or metal nitride film and said P+ polysilicon layer.

6. A memory cell comprising:

a semiconductor substrate;

a P well formed in said semiconductor substrate;

an N well formed in said semiconductor substrate;

an NMOS transistor defining an N type active region in said P well;

a PMOS transistor defining a P type active region in said N well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said NMOS transistor and a P+ polysilicon layer forming a portion of said PMOS transistor; and an oxide diffusion barrier layer formed in said polysilicide gate electrode structure between said polycrystalline silicon film and said metal, metal silicide, or metal nitride film and over only a portion of said isolation region, wherein said polysilicide gate electrode structure and said diffusion barrier layer are arranged such that migration of N+ dopants from said N+ polysilicon layer to said overlying metal, metal silicide, or metal nitride film is significantly impeded by said diffusion barrier layer.

7. A memory cell comprising:

a semiconductor substrate;

a P well formed in said semiconductor substrate;

an N well formed in said semiconductor substrate;

an NMOS transistor defining an N type active region in said P well;

a PMOS transistor defining a P type active region in said N well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said NMOS transistor and a P+ polysilicon layer forming a portion of said PMOS transistor; and an oxide diffusion barrier layer formed in said polysilicide gate electrode structure on a portion of said N+ polysilicon layer between said N+ polysilicon layer and said metal, metal silicide, or metal nitride film and over only a portion of said isolation region, wherein said oxide diffusion barrier layer does not extend over a portion of said P+ polysilicon layer.

8. A memory cell comprising:

a semiconductor substrate;

a P well formed in said semiconductor substrate;

an N well formed in said semiconductor substrate;

an NMOS transistor defining an N type active region in said P well;

a PMOS transistor defining a P type active region in said N well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said NMOS transistor and a P+ polysilicon layer forming a portion of said PMOS transistor; and an oxide diffusion barrier layer formed in said polysilicide gate electrode structure on a portion of said N+ polysilicon layer between said N+ polysilicon layer and said metal, metal silicide, or metal nitride film and over only a portion of said isolation region, wherein said oxide diffusion barrier layer is arranged such that said metal, metal silicide, or metal nitride film defines a P type common boundary with said P+ polysilicon layer that is significantly larger than an N type common boundary defined by said metal, metal silicide, or metal nitride film and said N+ polysilicon layer.

9. An SRAM memory cell comprising:

a semiconductor substrate;

a P well formed in said semiconductor substrate;

an N well formed in said semiconductor substrate;

a flip-flop formed by two access transistors and a pair of cross coupled inverters, wherein each pair of cross-coupled inverters includes a pull up transistor and a pull down transistor, and wherein said pull-up transistor defines a P type active region in said N well and said pull-down transistor defines an N type active region in said P well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said pull-down transistor and a P+ polysilicon layer fanning a portion of said pull-up transistor; and an oxide diffusion barrier layer formed in said polysilicide gate electrode structure between said polycrystalline silicon film and said metal, metal silicide, or metal nitride film on a portion of said polycrystalline silicon film, and over only a portion of said isolation region.

10. An SRAM memory cell comprising:

a semiconductor substrate;

a P well formed in said semiconductor substrate;

an N well formed in said semiconductor substrate;

a flip-flop formed by two access transistors and a pair of cross coupled inverters, wherein each pair of cross-coupled inverters includes a pull up transistor and a pull down transistor, and wherein said pull-up transistor defines a P type active region in said N well and said pull-down transistor defines an N type active region in said P well;

an isolation region arranged to isolate said N type active region from said P type active region;

a polysilicide gate electrode structure composed of a polycrystalline silicon film having a thickness of between about 500 Å and about 4000 Å and an overlying metal, metal silicide, or metal nitride film having a thickness of between about 500 Å and 4000 Å, wherein said polycrystalline silicon film comprises an N+ polysilicon layer forming a portion of said pull-down transistor and a P+ polysilicon layer forming a portion of said pull-up transistor; and an oxide diffusion barrier layer having a thickness of between about 3 Å and about 25 Å formed in said polysilicide gate electrode structure between said polycrystalline silicon film and said metal, metal silicide, or metal nitride film on a portion of said polycrystalline silicon film, and over only a portion of said isolation region.

11. An SRAM memory cell comprising:

a semiconductor substrate;

a P well formed in said semiconductor substrate;

an N well formed in said semiconductor substrate;

a flip-flop formed by two access transistors and a pair of cross coupled inverters, wherein each pair of cross-coupled inverters includes a pull up transistor and a pull down transistor, and wherein said pull-up transistor defines a P type active region in said N well and said pull-down transistor defines an N type active region in said P well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said pull-down transistor and a P+ polysilicon layer forming a portion of said pull-up transistor; and an oxide diffusion barrier layer formed in said polysilicide gate electrode structure between said polycrystalline silicon film and said metal, metal silicide, or metal nitride film and over only a portion of said isolation region, wherein said polysilicide gate electrode structure and said oxide diffusion barrier layer are arranged such that migration of P+ dopants from said P+ polysilicon layer to said overlying metal, metal silicide, or metal nitride film is significantly impeded by said oxide diffusion barrier layer.

12. An SRAM memory cell comprising:

a semiconductor substrate;

a P well formed in said semiconductor substrate;

an N well formed in said semiconductor substrate;

a flip-flop formed by two access transistors and a pair of cross coupled inverters, wherein each pair of cross-coupled inverters includes a pull up transistor and a pull down transistor, and wherein said pull-up transistor defines a P type active region in said N well and said pull-down transistor defines an N type active region in said P well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said pull-down transistor and a P+ polysilicon layer forming a portion of said pull-up transistor; and an oxide diffusion barrier layer formed in said polysilicide gate electrode structure between said polycrystalline silicon film and said metal, metal silicide, or metal nitride film and over only a portion of said isolation region, wherein said polysilicide gate electrode structure and said oxide diffusion barrier layer are arranged such that migration of N+ dopants from said N+ polysilicon layer to said overlying metal, metal silicide, or metal nitride film is significantly impeded by said oxide diffusion barrier layer.

13. A memory cell array comprising a plurality of SRAM cells arranged in rows and columns, wherein each cell of said array is connected to a word line and to a pair of bit lines and comprises:

a semiconductor substrate;

a P well formed in said semiconductor substrate;

an N well formed in said semiconductor substrate;

a flip-flop formed by two access transistors and a pair of cross coupled inverters, wherein each pair of cross-coupled inverters includes a pull up transistor and a pull down transistor, and wherein said pull-up transistor defines a P type active region in said N well and said pull-down transistor defines an N type active region in said P well;

an isolation region arranged to isolate said N type active region from said P type active region;

a polysilicide gate electrode structure composed of a polycrystalline silicon film and an overlying metal, metal silicide, or metal nitride film, wherein said polycrystalline silicon film comprises an N+ polysilicon layer forming a portion of said pull-down transistor and a P+ polysilicon layer forming a portion of said pull-up transistor; and an oxide diffusion barrier layer formed in said polysilicide gate electrode structure between said polycrystalline silicon film and said metal, metal silicide, or metal nitride film on a portion of said polycrystalline silicon film, and over only a portion of said isolation region.

14. A computer system including a microprocessor in communication with a memory cell array via a data communication path, wherein said memory cell array comprises a plurality of SRAM cells arranged in rows and columns, and wherein each cell of said array is connected to a word line and to a pair of bit lines and comprises:
- a semiconductor substrate;
- a P well formed in said semiconductor substrate;
- an N well formed in said semiconductor substrate;
- a flip-flop formed by two access transistors and a pair of cross coupled inverters, wherein each pair of cross-coupled inverters includes a pull up transistor and a pull down transistor, and wherein said pull-up transistor defines a P type active region in said N well and said pull-down transistor defines an N type active region in said P well;
- an isolation region arranged to isolate said N type active region from said P type active region;
- a polysilicide gate electrode structure composed of a polycrystalline silicon film and an overlying metal, metal silicide, or metal nitride film, wherein said polycrystalline silicon film comprises an N+ polysilicon layer forming a portion of said pull-down transistor and a P+ polysilicon layer forming a portion of said pull-up transistor and
- an oxide diffusion barrier layer formed in said polysilicide gate electrode structure between said polycrystalline silicon film and said metal, metal silicide, or metal nitride film on a portion of said polycrystalline silicon film and over only a portion of said isolation region.

15. A memory cell as claimed in claim 1 wherein said oxide diffusion barrier layer comprises silicon dioxide.

16. A memory cell as claimed in claim 1 wherein said oxide diffusion barrier layer has a thickness of less than 125 Å.

17. A memory cell as claimed in claim 1 wherein said oxide diffusion barrier layer has a thickness of between about 10 Å and about 15 Å.

18. A memory cell as claimed in claim 1 wherein said oxide diffusion barrier layer has a thickness of between about 3 Å and about 125 Å.

19. A memory cell as claimed in claim 1 wherein said oxide diffusion barrier layer has a thickness of between about 3 Å and about 50 Å.

20. A memory cell as claimed in claim 1 wherein said oxide diffusion barrier layer has a thickness of between about 3 Å and about 125 Å and said polycrystalline silicon film has a thickness of between about 500 Å and about 4000 Å.

21. A memory cell as claimed in claim 5 wherein metal, metal silicide, or metal nitride film form defines an overcoated portion of said P+ polysilicon layer and wherein said oxide diffusion barrier layer is formed in said polysilicide gate electrode structure between said metal, metal silicide, or metal nitride film and said P+ polysilicon layer over the entire extent of said overcoated portion of said P+ polysilicon layer.

22. A memory cell as claimed in claim 8 wherein metal, metal silicide, or metal nitride film form defines an overcoated portion of said N+ polysilicon layer and wherein said oxide diffusion barrier layer is formed in said polysilicide gate electrode structure between said metal, metal silicide, or metal nitride film and said N+ polysilicon layer over the entire extent of said overcoated portion of said N+ polysilicon layer.

23. A gate electrode structure for a semiconductive device having N type and P type active regions separated by an isolation region, said gate electrode structure comprising:
- a film having an N+ polysilicon layer over the N type active region and a polysilicon layer over the P type active region;
- an oxide layer formed on a portion of said film and over only a portion of said isolation region; and
- a metal, metal silicide, or metal nitride film overlaying said film and said oxide layer.

24. A gate electrode structure as claimed by claim 23 wherein said oxide layer is formed on said N+ polysilicon layer.

25. A gate electrode structure as claimed by claim 23 wherein said oxide layer is formed on said P+ polysilicon layer.

26. A gate electrode structure as claimed by claim 23 wherein said N+ polysilicon layer forms a portion of a pull-down transistor, and said oxide layer is formed on said N+ polysilicon layer.

27. A gaze electrode structure as claimed by claim 23 wherein said P+ polysilicon layer forms a portion of a pull-up transistor, and said oxide layer is formed on said P+ polysilicon layer.

28. A gate electrode structure as claimed by claim 23 wherein said oxide layer is silicon dioxide.

29. A gate electrode structure as claimed by claim 23 wherein said oxide layer has a thickness under 125 Å.

30. A memory cell comprising:
- a semiconductor substrate having first and second gate oxide layers;
- a P well formed in said semiconductor substrate;
- a N well formed In said semiconductor substrate adjacent to said P well;
- a N type active region defined in said P well;
- a P type active region defined in said N well;
- an isolation region arranged to isolate said N type active region from said P type active region, and separate said first and second gate oxide layers; and
- a gate electrode structure having a film with an N+ polysilicon layer on said first gate oxide layer over said N type active region and on a first portion of said isolation region, and a P+ polysilicon layer on said second gate oxide layer over said P type active region and on a second portion of said isolation region, an oxide layer formed on a portion of said film and over only one of said first and second portions of said isolation region, and a metal, metal silicide, or metal nitride film overlaying said film and said oxide layer.

31. A gate electrode structure for a semiconductive device having N type and P type active regions separated by an isolation region, said gate electrode structure comprising:
- a first layer having an N+ polysilicon portion over the N type active region and a P+ polysilicon portion over the P type active region;
- a second layer having a material selected from the group comprising a metal, metal silicide, and metal nitride; and
- an oxide layer formed between and in contact with both said first and second layers, wherein said oxide layer is noncoplanar with said first layer and extends over at least a portion of the isolation region.

32. A gate electrode structure as claimed by claim 31 wherein said oxide layer is formed on said N+ polysilicon portion.

33. A gate electrode structure as claimed by claim 31 wherein said oxide layer is formed on said P+ polysilicon portion.

34. A gate electrode structure as claimed by claim 31 wherein said N+ polysilicon portion forms part of a pull-down transistor, and said oxide layer is formed on said N+ polysilicon portion.

35. A gate electrode structure as claimed by claim 31 herein said P+ polysilicon portion forms part of a pull-up transistor, and said oxide layer is formed on said P+ polysilicon portion.

36. A gate electrode structure as claimed by claim 31 wherein said oxide layer is silicon dioxide.

37. A gate electrode structure as claimed by claim 31 wherein said oxide layer has a thickness under 125 Å.

38. A memory cell comprising:
   a semiconductor substrate having first and second gate oxide layers;
   a P well formed in said semiconductor substrate;
   a N well formed in said semiconductor substrate adjacent to said P well;
   a N type active region defined in said P well;
   a P type active region defined in said N well;
   an isolation region arranged to isolate said N type active region from said P type active region and to separate said first and second gate oxide layers;
   a polycrystalline silicon layer overlaying said oxide layers and said isolation region, said polycrystal line silicon layer having an N+ polysilicon portion over said N type active region and a P+ polysilicon portion over said P type active region;
   a metal, metal silicide, or metal nitride film layer overlying said polycrystalline silicon layer; and
   an oxide layer formed between and in contact with both said polycrystalline silicon layer and said a metal, metal silicide, or metal nitride film layer, wherein said oxide layer is noncoplanar with said polycrystalline silicon layer and extends over at least a portion of said isolation region.

* * * * *

UNITED STATES PATENT AND TRADEMARK OFFICE
CERTIFICATE OF CORRECTION

PATENT NO. : 6,812,529 B2  
DATED : November 2, 2004  
INVENTOR(S) : Trivedi et al.

It is certified that error appears in the above-identified patent and that said Letters Patent is hereby corrected as shown below:

Title page,
Item [75], Inventors, "John D. Trivedi" should read -- Jigish D. Trivedi --.

Column 7,
Line 15, "125 A" should read -- 125 Å --.

Column 11,
Line 1, "maid" should read -- said --.
Line 23, "transistor and" should read -- transistor; and --.

Column 13,
Line 3, "fanning" should read -- forming --.

Column 15,
Line 66, "and a" should read -- and a P+ --.

Column 16,
Line 15, "gaze" should read -- gate --.

Signed and Sealed this

Twenty-first Day of March, 2006

JON W. DUDAS
*Director of the United States Patent and Trademark Office*